United States Patent
Auken

[19]

[11] Patent Number: 6,150,901
[45] Date of Patent: Nov. 21, 2000

[54] PROGRAMMABLE RF/IF BANDPASS FILTER UTILIZING MEM DEVICES

[75] Inventor: Floyd Van Auken, Cedar Rapids, Iowa

[73] Assignee: Rockwell Collins, Inc., Cedar Rapids, Iowa

[21] Appl. No.: 09/197,166

[22] Filed: Nov. 20, 1998

[51] Int. Cl.[7] ................................ H03H 7/12; H03H 9/46
[52] U.S. Cl. ......................... 333/174; 333/165; 333/262
[58] Field of Search ..................................... 333/165, 166, 333/174, 175, 262

[56] References Cited

U.S. PATENT DOCUMENTS

| | | | |
|---|---|---|---|
| 4,002,987 | 1/1977 | Kuhn ........................................ | 328/207 |
| 4,002,988 | 1/1977 | Cardon et al. ........................... | 328/138 |
| 4,002,989 | 1/1977 | Cardon et al. ........................... | 328/140 |
| 4,004,236 | 1/1977 | Cardon et al. ........................... | 328/138 |
| 4,453,145 | 6/1984 | Schuster .................................. | 333/174 |
| 5,194,837 | 3/1993 | Smythe, Jr. et al. .................... | 333/166 |
| 5,225,798 | 7/1993 | Hunsinger et al. ..................... | 333/165 |
| 5,272,663 | 12/1993 | Jones et al. ............................. | 364/825 |
| 5,578,976 | 11/1996 | Yao ......................................... | 333/262 |
| 5,783,977 | 7/1998 | Chethik .................................. | 333/174 |
| 5,790,959 | 8/1998 | Scherer .................................. | 455/561 |
| 5,808,527 | 9/1998 | De Los Santos ................... | 333/262 X |
| 5,880,921 | 3/1999 | Tham et al. ........................ | 333/262 X |

*Primary Examiner*—Justin P. Bettendorf
*Attorney, Agent, or Firm*—Nathan O. Jensen; Kyle Eppele; J. P. O'Shaughnessy

[57] ABSTRACT

A programmable high frequency (HF) bandpass filter is disclosed. The programmable filter has a tunable bandwidth and center frequency over a large range of the radio frequency (RF) and intermediate frequency (IF) spectrum. The programmable filter incorporates micro-electro-mechanical switches (MEMS), Acoustic Charge Transport (ACT) devices, or a combination thereof, to provide tunability of the bandpass filter response characteristics.

7 Claims, 4 Drawing Sheets

PROGRAMMABLE RF/IF BANDPASS FILTER UTILIZING MEM DEVICES

FIELD OF THE INVENTION

The present invention relates generally to a programmable high frequency (HF) bandpass filter. More specifically, the present invention relates to a programmable radio frequency/intermediate frequency (RF/IF) bandpass filter. More specifically still, the present invention relates to a programmable RF/IF bandpass filter utilizing micro-electro-mechanical (MEM) devices, acoustic charge transport (ACT) devices or a combination thereof.

BACKGROUND OF THE INVENTION

Civilian and military radio systems can be implemented on different platforms to perform diverse warfare, location, communication, navigation and identification functions. Platforms can include backpacks, satellites, rockets, vehicles, naval vessels, aircraft, shelters, or other structures. Radio systems can even be handheld systems. The communication functions can involve the reception and the transmission of voice, data, or both by computer equipment or by personnel.

Radio systems typically include electronic filters. Generally, electronic filters are signal processing devices used in radio frequency (RF) communications, electronic warfare, and all other communication, navigation, and identification (CNI) systems to improve the signal-to-noise ratio and to reject both external and internal interference. Conventionally, multi-band receiver and transmitter architectures require multiple bandpass filters with a variety of fixed frequencies and bandwidths. The multiple bandpass filters have frequencies and bandwidths configured for each individual CNI, EW, and radar signal type waveform or other waveform signal. For example, a separate bandpass filter is often required for each RF application. Utilizing multiple bandpass filters increases the size and costs associated with the receiver and transmitter. Reducing the number of bandpass filters, which are bulky and expensive, can dramatically reduce the overall size and cost of the radio system.

Therefore, there is a need and desire for a programmable filter that eliminates the need for multiple filters in multi-band radio systems and offers a solution for future open system architectures. There is also a need and desire for a programmable filter where the filter parameters can be varied to adjust filtering bandwidths and tuning. Further, there is also a need and desire for a programmable filter that reduces the size and costs associated with multiple bandpass filters.

SUMMARY OF THE INVENTION

The present invention relates to a programmable high frequency bandpass filter. The filter includes an input for receiving an input signal and an output for providing a filtered signal in accordance with a programmed frequency response. A filter component is coupled between the input and the output. The filter component includes a plurality of micro-electro-mechanical switches, the micro-electro-mechanical switches being manipulated so the filter component provides the programmed frequency response.

The present invention further relates to a programmable high frequency bandpass filter capable of filtering an input signal in accordance with a plurality of different bandwidths and a plurality of different center frequencies. The filter includes an input for receiving the input signal and a filter control input for receiving a filter control signal indicative of a selected bandwidth and a selected center frequency. The filter also includes an output for providing a filtered signal in accordance with the selected bandwidth and selected center frequency and a filter component coupled between the input and the output, The filter component includes a plurality of microelectro-mechanical switches, the micro-electro-mechanical switches being manipulated so the filter component provides the filtered signal.

The present invention further still relates to a method of filtering a high frequency signal. The method includes receiving a control signal indicative of a frequency response, manipulating a plurality of MEM switches in accordance with the control signal, and providing the high frequency signal through a filter element. The filter element is coupled to the MEM switches.

The present invention may include a capacitive ladder used as a programmable attenuator.

The present invention may also include an acoustic charge transport device operating in the ultra high frequency band.

BRIEF DESCRIPTION OF THE DRAWINGS

The invention will hereafter be described with reference to the accompanying drawings, wherein like reference numerals denote like elements in the various drawings, and.

DETAILED DESCRIPTION OF THE PREFERRED EMBODIMENT

Figure 1:
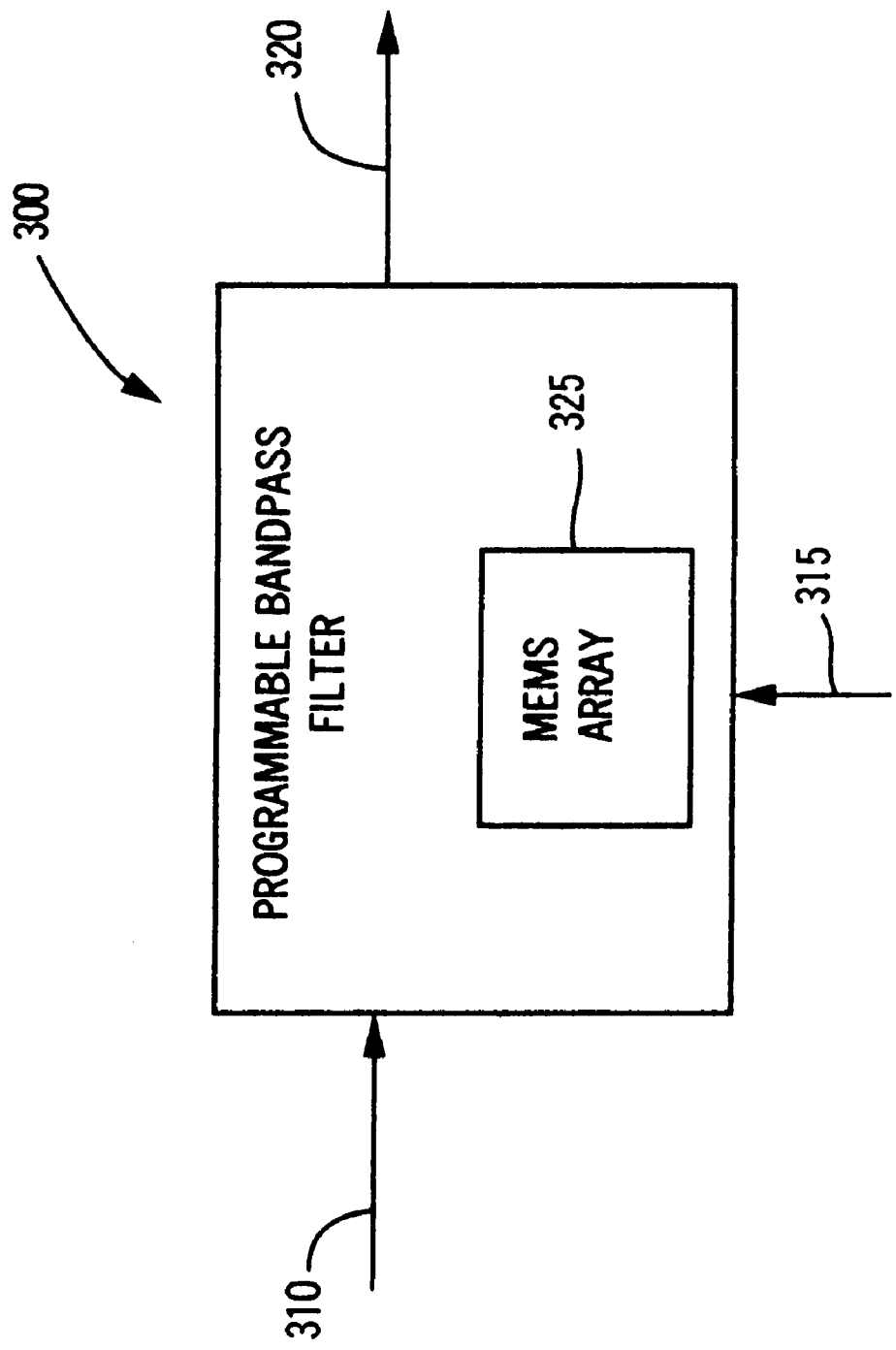
FIG. 1 is an exemplary block diagram of a programmable bandpass filter in accordance with an exemplary embodiment of the present invention.

With reference to FIG. 1, a programmable bandpass filter 300 includes an RF input 310, an RF output 320, and a control input 315. Programmable bandpass filter 300 advantageously includes a micro-electro-mechanical system (MEMS) switch array 325.

Preferably, programmable bandpass filter 300 receives a digital signal or other control signal at control input 315. The control signal is indicative of a selectable bandwidth and frequency for filter 300.

For example, the control signal can indicate a selectable center frequency, a bandwidth, or both. Thus, the control signal selects a frequency response for filter 300.

MEMS array 325 is configured in accordance with the selected frequency response, e.g., bandwidth and center frequency. Once MEMS array 325 is configured, bandpass filter 300 filters an incoming signal at input 310 and provides the filtered signal at output 320. For example, the control signal at input 315 can configure filter 300 for at least five bands, such as bands between 30–60 MegaHertz (MHz), 60–120 MHz, 120–200 MHz, 200–400 MHz and 400–700 MHz. Alternatively, other frequency ranges can be programmable for filter 300.

Bandpass filter 300 may include fixed elements configured by MEMS array 325. Fixed elements can include capacitors, variable capacitors, inductors, and switches. MEMS array 325 can allow for variable bandwidth and variable frequency responses for filter 300.

Alternatively, filter 300 can include an acoustic charge transport (ACT) element. MEMS array 325 adjusts tap coefficients associated with the ACT element. Electronic filters such as filter 300, are necessary and important elements in any receiver and transmitter architecture. Advances in receiver and transmitter architectures require exploiting technological advances in micro-electro-mechanical systems (MEMS), acoustic charge transport (ACT) devices, and digital signal processing (DSP) to realize improved performance, modularity, and versatility. Filter 300 advantageously utilizes the properties of MEM switches to provide a programmable bandpass filter.

MEM switches in MEMS array 325 can be any miniature switch having contacts which are mechanically opened and closed. The contacts can be opened and closed based upon electromagnetic or electrostatic principles. For instance, the MEM switch can be a micromachine miniature switch disposed on a semiconductor substrate, such as, silicon, glass, or gallium arsenide. The switch can use a suspended silicon dioxide microbeam as a cantilever arm which connects platinum-to-gold electrocontacts in response to electrostatic actuation.

The switch can also be a micro-electro-mechanical switch device where a polysilicon panel overlays a trench. The polysilicon panel is electromagnetically actuated to deform and to connect to a contact provided on a glass cap wafer disposed over the trench. The switch can also be a microelectronic switch having a configuration similar to a field effect transistor (FET). The term micro-electro-mechanical switch or MEM switch refers to any small-scale switch which mechanically moves.

Figure 2:
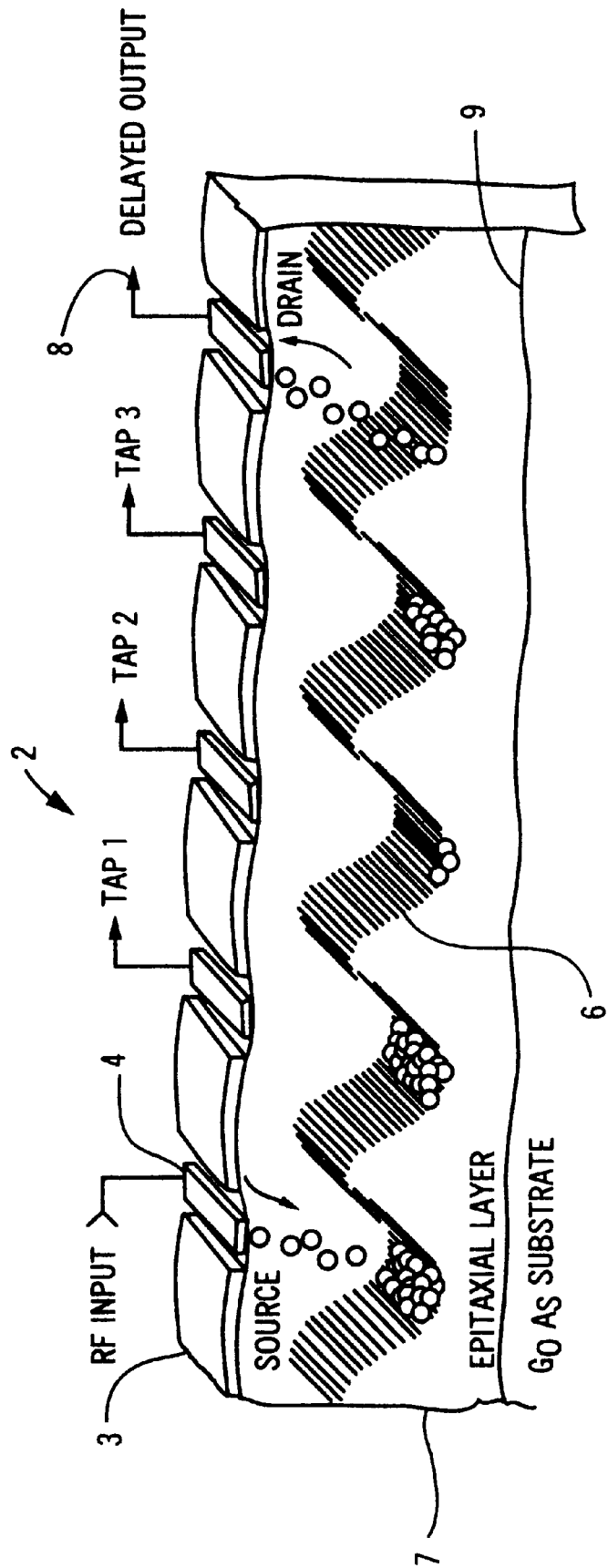
FIG. 2 is a cross-sectional schematic diagram of an acoustic charge transport (ACT) device of the prior art.

Referring now to FIG. 2, a conventional acoustic charged transport (ACT) device 2 is depicted. ACT device 2 is a high speed monolithic charged transport device that provides the fundamental function of RF/IF signal delay. A piezoelectric material 3 includes a series of taps, i.e., tap 1, tap 2, tap 3, etc., on a top surface. An RF signal line is coupled to input terminal 4. The RF signal is delayed in transmission through piezoelectric material 3 by means of an ultrasonic transducer induced surface acoustic wave (SAW) which propagates at the speed of sound across the crystal surface. The surface wave induces a sinusoidal variation 6 in the electric potential of an epitaxial layer 7 that interacts with the RF/IF signal so that a delayed RF/IF output signal is provided at output terminal 8 of ACT device 2. In one arrangement of ACT device 2 epitaxial layer 7 overlies a gallium arsenide (GaAs) substrate 9.

Figure 3:
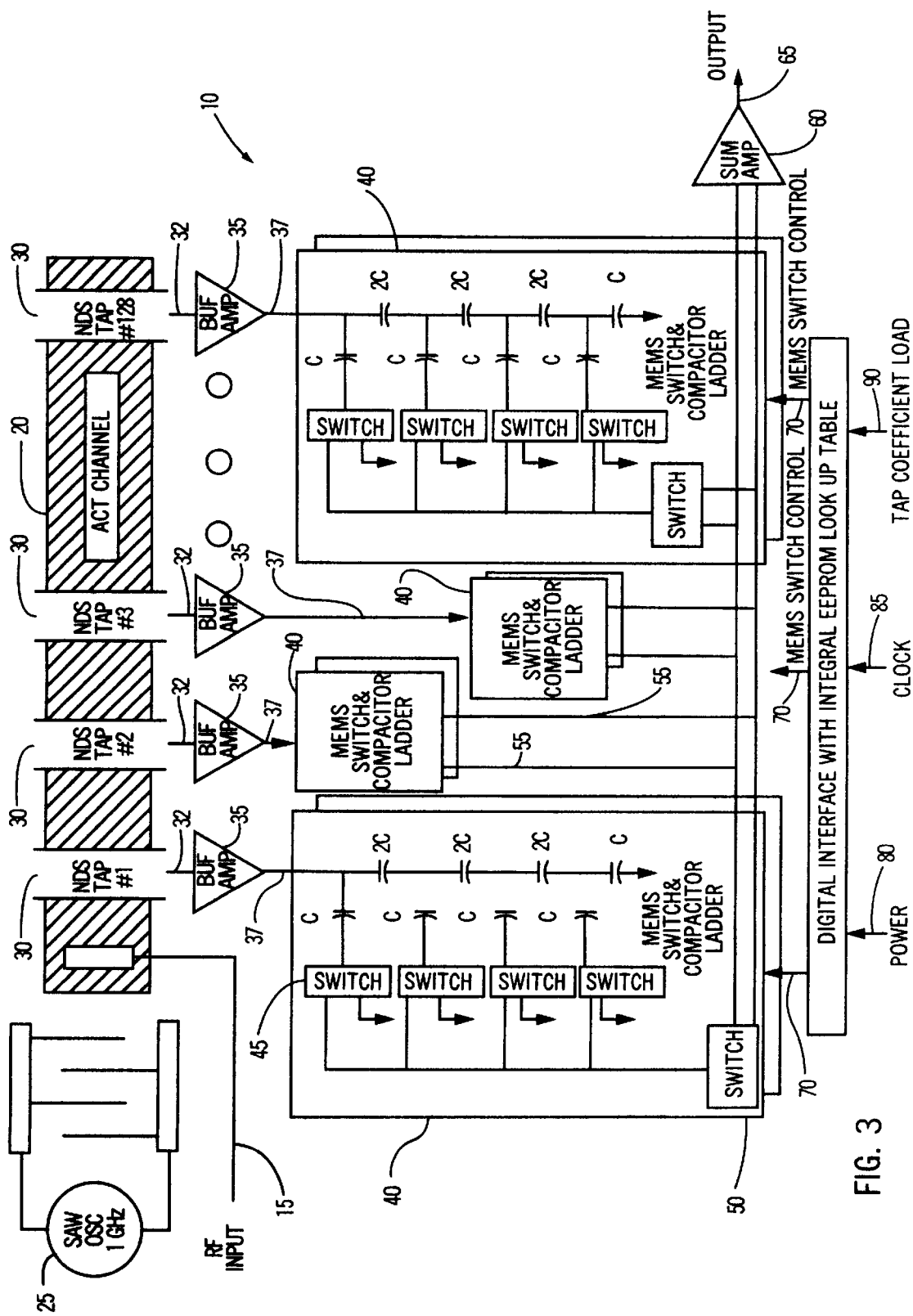
FIG. 3 is a block diagram of a programmable RF/IF bandpass filter using ACT/MEMS technology in accordance with another exemplary embodiment of the present invention.

Referring now to FIG. 3, a block diagram of a programmable RF/IF bandpass filter 10 using ACT/MEMS technology is depicted. Filter 10 is a more detailed version of programmable bandpass filter 300 described with reference to FIG. 1. An RF/IF signal is communicated along an input line 15 to an ACT channel 20. ACT channel 20 is a filter element which uses surface acoustic wave (SAW) technology, including a SAW oscillator 25. In one embodiment of the present invention, SAW oscillator 25 is a one Gigahertz (GHz) oscillator. SAW oscillator 25 and RF/IF input 15 are coupled to ACT channel 20. Generally, ACT devices are fundamentally programmable analog signal processors capable of operating into the L-band frequency range. The applications for ACT technology range from matched filters, adaptive interference cancellers, programmable bandwidth filters, channel equalizers, auto correlators, pattern recognizers, signature identifiers, etc.

ACT device 20 produces finite impulse response filtering using the configuration depicted in FIG. 3. ACT channel 20 converts the input signal 15 into a series of electron packets that are transported in the traveling potential wells of the SAW produced by oscillator 25. As the charge packets propagate on the ACT channel 20, non-destructive sensing electrodes 30 are used to tap the signal at fixed intervals. Each of weighting circuits 40 weight the tap signals from all of the 128 taps, the weighted signals being summed to perform the finite impulse response filtering operation.

RF input 15 typically communicates a signal having a frequency in the range of about 30–500 Megahertz. ACT channel 20 has a multiplicity of nondestructive sensing (NDS) taps 30 that are physically separated from each other along ACT channel 20. Each of taps 30 are oriented across ACT channel 20 and are adapted to pick up the RF energy communicated along ACT channel 20. Each NDS tap 30 picks up RF energy and delays the signal by a fixed interval, each successive tap delaying the signal by an additional fixed interval. Thus, the filter is a delay line concept having fixed precise delays. In an alternative embodiment, these delays are not necessarily fixed but may be varied.

In one embodiment of the present invention, there will be 128 NDS taps 30 or in an alternative embodiment there will be 256 NDS taps 30. However, any number of NDS taps 30 may be used. Further, in one embodiment of the present invention each tap is representative of a six nanosecond delay. Therefore, as depicted in FIG. 3, ACT channel 20 has 128 NDS taps 30 producing a maximum delay of 768 nanoseconds.

Each NDS tap 30 has an output 32 coupled to a buffering amplifier 35. Each buffering amplifier 35 has an output 37 coupled to a weighting circuit 40. From a functional standpoint each weighting circuit 40 represents a programmable RF attenuator.

In one embodiment of the present invention, weighting circuits 40 are MEM switch and capacitor ladders. In general, MEMS use micro-scale mechanical devices to perform functions (such as sensing and actuation) conventionally achieved with solid-state or bulk mechanical approaches. MEMS technology is ideally applied in the area of electrical switching. MEM switches provide dramatic advantages when compared with solid-state switching approaches (such as FETs or PIN diodes). The desirability of MEM switches stems from their desirable characteristics including low insertion loss when closed (less than −0.1 dB), high isolation when open (greater than 70 dB), broad frequency response (DC to beyond 25 GHz), low power consumption to actuate, small physical size, and compatibility with integration with other electronic components. MEM switches are relatively fast operating switches when compared to conventional mechanical switches. MEM switches are capable of switching when a different bandwidth or different center frequency is selected, with a response time of under 10 microseconds. The benefits of MEMS technology is important in system architectures using large numbers of switching elements including the programmable filters disclosed herein.

Each weighting circuit 40 includes a parallel array of capacitor and switch combinations connected in parallel with each other. Each MEM switch 45 may be opened such that a particular leg of the ladder becomes an inactive branch of weighting circuit 40, or alternatively each MEM switch 45 may be switched to ground which activates a particular branch of the ladder from weighting circuit 40. For each weighting circuit, selection of the proper combination of switch configurations produces a different NDS tap coefficient. Each MEM switch and capacitor ladder 40 includes a main MEM switch 50 which controls the output of the particular weighting circuit 40.

Each of the plurality of weighting circuits 40 has outputs 55 coupled to a summing amplifier 60, the output 65 of summing amplifier 60 being the filtered output of RF input signal 15.

Each of MEM switch and capacitor ladders 40 are coupled to a MEM switch control 70. Each of MEM switch control 70 are coupled to a digital interface 75 having a programmable look-up table, the look-up table having the tap coefficients and the respective MEM switch configurations for given filter response characteristics. The digital interface 75 is coupled to a power source 80, a clock 85, and a tap coefficient load input 90. Thus, digital interface 75 provides a control signal that manipulates switch 45 and switch 50 for the appropriate bandwidth response.

Figure 4:
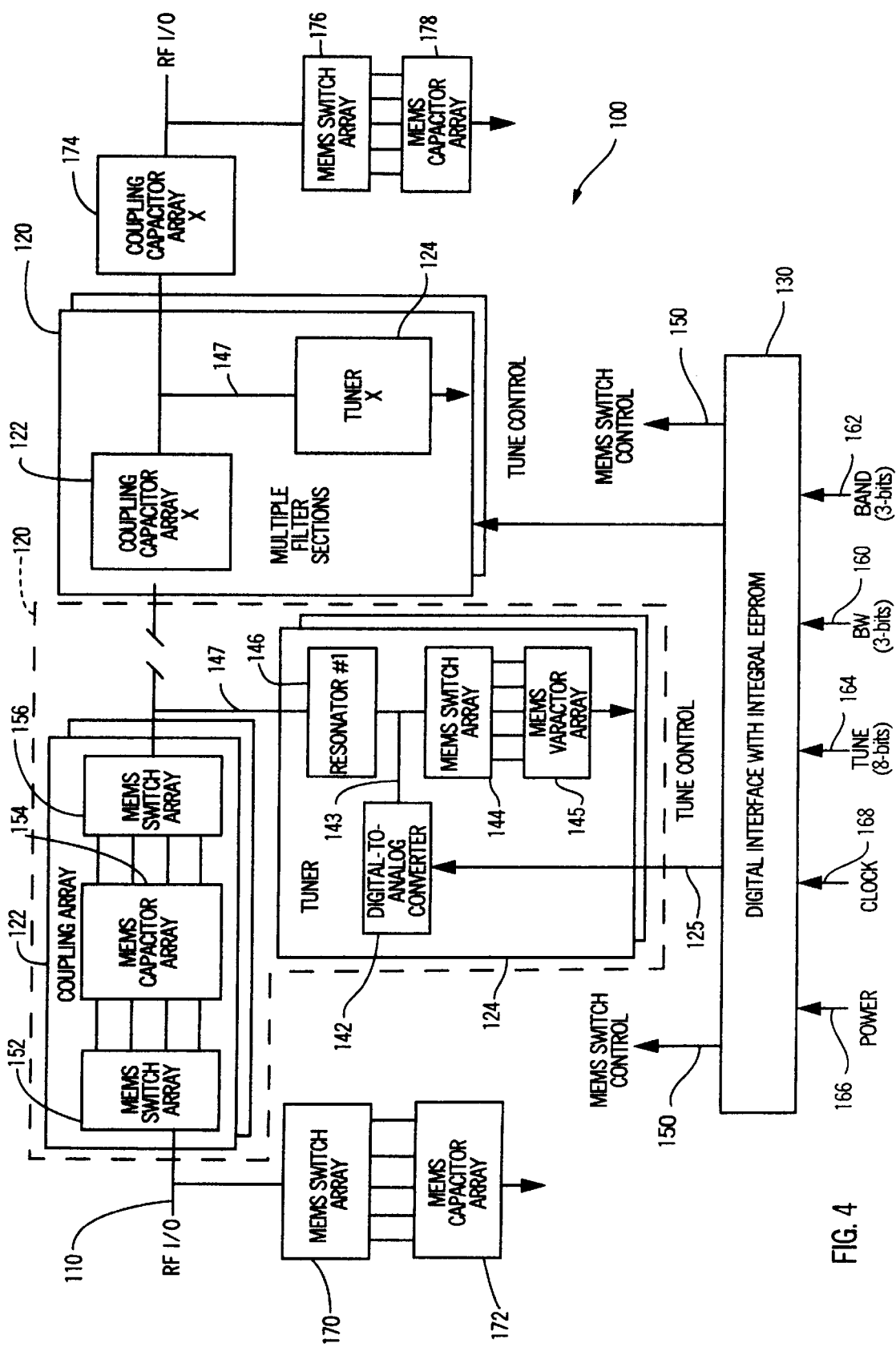
FIG. 4 is a block diagram of a programmable RF/IF bandpass filter using MEMS technology in accordance with yet another exemplary embodiment of the present invention.

Referring now to FIG. 4, an alternative embodiment for a programmable RF/IF bandpass filter 100 using MEMS technology is shown. Programmable filter 100 is a more detailed version of programmable bandpass filter 300 described with reference to FIG. 1. Filter 100 generally includes an RF/IF input/output line 10, a plurality of multiple filter sections 120, and a digital programmable interface 130. Each of multiple filter sections 120 include a coupling capacitor array 122 coupled in series with the RF/IF input/output line 110. Each multiple filter section 120 also has a tuner 124 coupled with the output of coupling capacitor array 122, capable of tuning the filter section to a programmed frequency response to filter the signal communicated along line 110. Tuner 124 is coupled to digital interface 130 and receives digital signals communicated along a tune control line 125. Tuner 124 includes a digital to analog (D/A) converter 142 that converts the digital command signals from digital interface 130 to analog DC tune voltage signals, along line 143.

MEM switch array 144 is configured by MEM switch control outputs 150, from digital interface 130, to select a MEMS varactor in the MEMS varactor array 145. The analog tune voltage signal on line 143 tunes the selected MEMS varactor in MEMS varactor array 145 thus reacting with resonator 146 to filter the input signal.

Each multiple filter section further has a coupling capacitor array 122. Coupling capacitor array 122 includes a first MEM switch array 152 coupled to a MEMS capacitor array 154 and further coupled to a second MEM switch array 156. MEM switch arrays 152 and 156 are controlled by signals from MEM switch control 150 to provide the proper signal coupling, dependent upon the desired bandwidth, center frequency, and tuning, provided to digital interface 130 along control lines 160, 162, and 164 respectively. Further, digital interface 130 receives power through a power input 166 and a clock signal through a clock input 168. Filter 100 also includes a MEM switch array 170 coupled with a MEMS input capacitor array 172 coupled to line 10. As with all MEM switches in filter 100, MEM switch array 170 is controlled through a MEM switch control 150 to provide the programmed filter response characteristic. Similarly, a back end coupling capacitor array 174 and a MEM switch array 176 and MEMS output capacitor array 178 are included, also being controlled through a MEM switch control 150 to provide the appropriate frequency response and impedance matching of filter 100.

It is understood that while the detailed drawings and examples given describe preferred exemplary embodiments of the present invention, they are for the purposes of illustration only. The method and apparatus of the invention is not limited to the precise details and conditions disclosed. For example, the invention is not limited to the number of taps or filter sections disclosed. Alternatively, any number of taps and/or filter sections can be used, configured appropriately for the application. Further, the invention is not limited to communication devices or RF/IF communication signals, any of a number of electrical signals may be filtered using the disclosed device. Various changes may be made to the details disclosed without departing from the spirit of the invention, which is defined by the following claims.

What is claimed is:

1. A programmable high frequency bandpass filter for providing a programmed frequency response comprising:
   an input for receiving an input signal;
   a micro-electro-mechanical system input capacitor array connected across the input to a ground to provide input matching for the input signal;
   a plurality of filter sections connected to the input for filtering the input signal and providing a filtered output signal with the programmed frequency response each of said filter sections further comprising:
   a coupling capacitor array connected in series with the input; and
   a tuner connected across the coupling capacitor array to the ground for filtering the input signal to provide the filtered output signal with the programmed frequency response;
   a back end coupling capacitor array connected to a last filter section in the plurality of filter sections for coupling the filtered output signal to an output;
   a micro-electro-mechanical system output capacitor array connected across the output to the ground to provide output matching for the output signal; and
   a digital programmable interface for controlling the micro-electro-mechanical system input capacitor array, the coupling capacitor array, the tuner array, the back end coupling capacitor array, and the micro-electro-mechanical system output capacitor array to provide the output signal with the programmed frequency response.

2. The programmable high frequency bandpass filter of claim 1 wherein the micro-electro-mechanical system input capacitor array further comprises an array of micro-electro-mechanical system capacitors switched by an array of micro-electro-mechanical system switches.

3. The programmable high frequency bandpass filter of claim 1 wherein the coupling capacitor array further comprises a first micro-electro-mechanical system switch array coupled to a micro-electro-mechanical system capacitor array and further coupled to a second micro-electro-mechanical switch array.

4. The programmable high frequency bandpass filter of claim 1 wherein the tuner further comprises:
   a resonator with a first end connected to the coupling capacitor array;
   a micro-electro-mechanical system switch array connected to a second end of the resonator;

a micro-electro-mechanical system varactor array connected to the microelectro-mechanical system switch array said micro-electro-mechanical system switch array operably connected to select an individual micro-electro-mechanical system varactor; and a digital-to-analog converter for converting tune control digital signals from the digital programmable interface to a tune voltage signal to tune the individual micro-electro-mechanical system varactor to provide the programmed frequency response in cooperation with the resonator.

5. The programmable high frequency bandpass filter of claim 1 wherein the a back end coupling capacitor array further comprises a first micro-electro-mechanical system switch array coupled to a micro-electro-mechanical system capacitor array and further coupled to a second micro-electro-mechanical system switch array.

6. The programmable high frequency bandpass filter of claim 1 wherein the output capacitor array further comprises an array of micro-electro-mechanical system capacitors switched by an array of micro-electro-mechanical system switches.

7. The programmable high frequency bandpass filter of claim 1 wherein the digital programmable interface converts selected bandwidth, selected center frequency, and tune data into tune control signals and micro-electro-mechanical system switch control digital signals.

* * * * *